US009147954B2

(12) United States Patent
Yang

(10) Patent No.: US 9,147,954 B2
(45) Date of Patent: Sep. 29, 2015

(54) CONNECTOR

(71) Applicant: Teecons Technology Ltd., Kaohsiung (TW)

(72) Inventor: Yi-Chih Yang, Kaohsiung (TW)

(73) Assignee: Teecons Technology Ltd., Kaohsiung (TW)

( * ) Notice: Subject to any disclaimer, the term of this patent is extended or adjusted under 35 U.S.C. 154(b) by 0 days.

(21) Appl. No.: 14/320,710

(22) Filed: Jul. 1, 2014

(65) Prior Publication Data

US 2015/0011102 A1 Jan. 8, 2015

(30) Foreign Application Priority Data

Jul. 8, 2013 (TW) ............................ 102212835 U

(51) Int. Cl.

| | |
|---|---|
| ***H01R 12/00*** | (2006.01) |
| ***H05K 1/00*** | (2006.01) |
| ***H01R 12/73*** | (2011.01) |
| ***H01R 12/72*** | (2011.01) |
| ***H01R 4/48*** | (2006.01) |
| ***H01R 13/629*** | (2006.01) |

(52) U.S. Cl.
CPC ................ *H01R 12/732* (2013.01); *H01R 4/48* (2013.01); *H01R 12/721* (2013.01); *H01R 13/629* (2013.01)

(58) Field of Classification Search
CPC ...... H01R 12/732; H01R 13/629; H01R 4/48; H01R 12/721; H01R 12/73
USPC ............................................ 439/61, 377, 62
See application file for complete search history.

(56) References Cited

U.S. PATENT DOCUMENTS 7,955,092 B2 * 6/2011 Yang et al. ...................... 439/72

* cited by examiner

*Primary Examiner* — Javaid Nasri
(74) *Attorney, Agent, or Firm* — Alan D. Kamrath; Kamrath IP Lawfirm, P.A.

(57) ABSTRACT

A connector connecting a main circuit board and a sub circuit board has two bases, two electrical contacting sets, two resilient bar sets and two mounting brackets. The bases are mounted on the main circuit board. The electrical contacting sets are mounted respectively in the bases and each electrical contacting set has multiple electrical contacting elements. The resilient bar sets are mounted respectively on the bases. The mounting brackets are mounted respectively on the bases and cover the electrical contacting sets and the resilient bar sets. Circuit-board-receiving channels are defined between the bases and the mounting brackets for receiving the sub circuit board such that combination of the main circuit board and the sub circuit board are parallel and flat.

10 Claims, 9 Drawing Sheets

CONNECTOR

BACKGROUND OF THE INVENTION

1. Field of the Invention

The present invention relates to a connector, and more particularly to a connector that is mounted on a main circuit board and allows a sub circuit board to be connected electrically horizontally to the main circuit board through the connector.

2. Description of Related Art

A main circuit board usually has a connector mounted thereon to connect a sub circuit board with specific functions to the main circuit board. The connector has multiple electrical contacting elements mounted thereon. Each electrical contacting element has a contacting end contacting one of multiple pad contacts on the main circuit board. The connector allows the sub circuit board to be inserted perpendicularly in the connector. The sub circuit board has multiple terminals respectively contacting the electrical contacting elements such that the sub circuit board is connected electrically to the main circuit board through the connector.

However, the conventional connector is only allowed to be mounted on a surface of the main circuit board, which makes the sub circuit board inserted in the connector along a direction perpendicular to the main circuit board. Therefore, an electrical device, accommodating the main circuit board, the connector and the sub circuit board, needs to have an enormous cubic room for receiving the aforementioned circuit boards and connector, which disadvantages the compactness and lightweight of the electrical device, especially when the electrical device is to be built flattened for portable purposes.

To overcome the shortcomings, the present invention provides a connector to mitigate or obviate the aforementioned problems.

SUMMARY OF THE INVENTION

The main objective of the invention is to provide a connector that is mounted on a main circuit board and allows a sub circuit board to be connected electrically horizontally to the main circuit board through the connector.

A connector connecting a main circuit board and a sub circuit board has two bases, two electrical contacting sets, two resilient bar sets and two mounting brackets. The bases are mounted on the main circuit board. The electrical contacting sets are mounted respectively in the bases and each electrical contacting set has multiple electrical contacting elements. The resilient bar sets are mounted respectively on the bases. The mounting brackets are mounted respectively on the bases and cover the electrical contacting sets and the resilient bar sets. Circuit-board-receiving channels are defined between the bases and the mounting brackets for receiving the sub circuit board such that combination of the main circuit board and the sub circuit board are parallel and flat.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
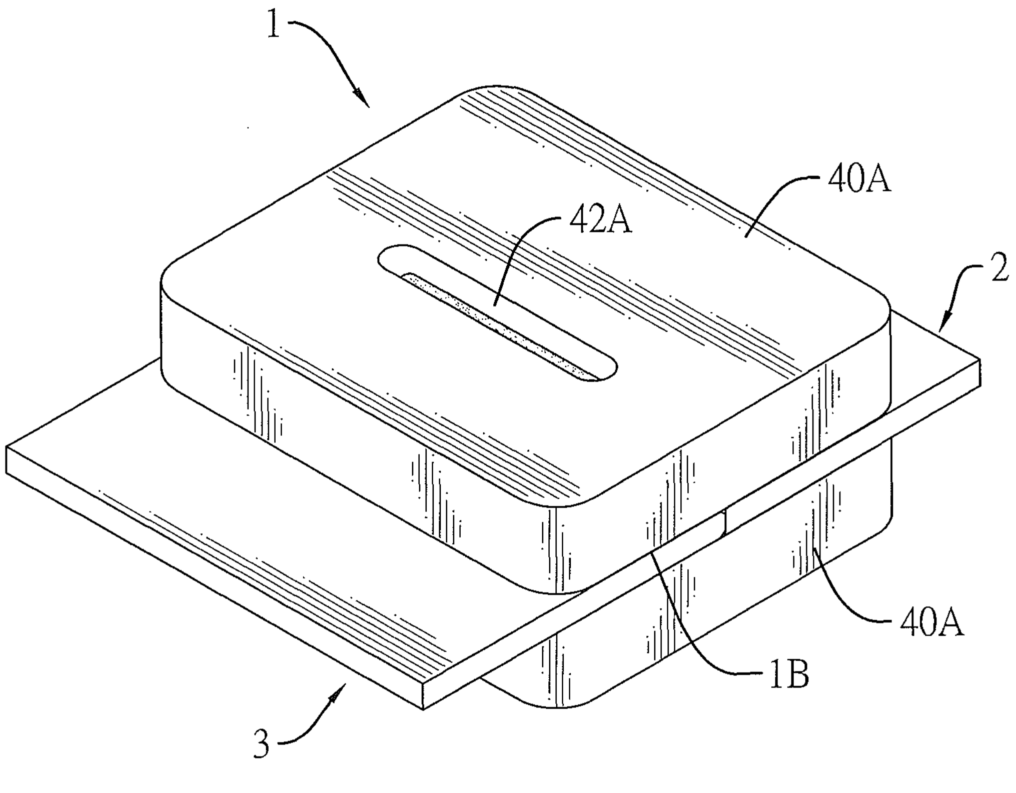
FIG. 1 is a perspective view of a first embodiment of a connector in accordance with the present invention connected a main circuit board and a sub circuit board together.
Figure 2:
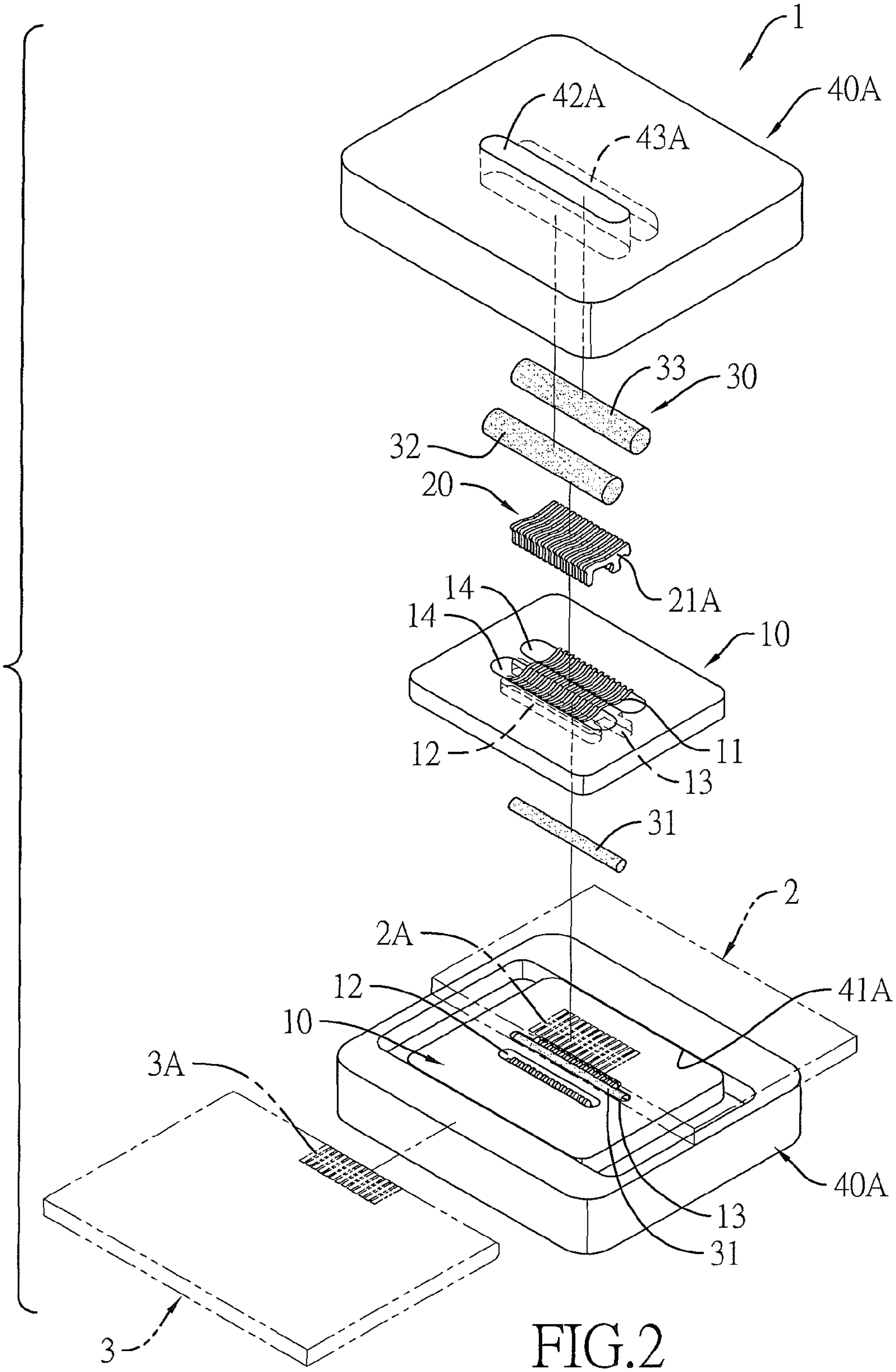
FIG. 2 is a partially exploded perspective view of the connector in FIG. 1 with the main circuit board and the sub circuit board.
Figure 2A:
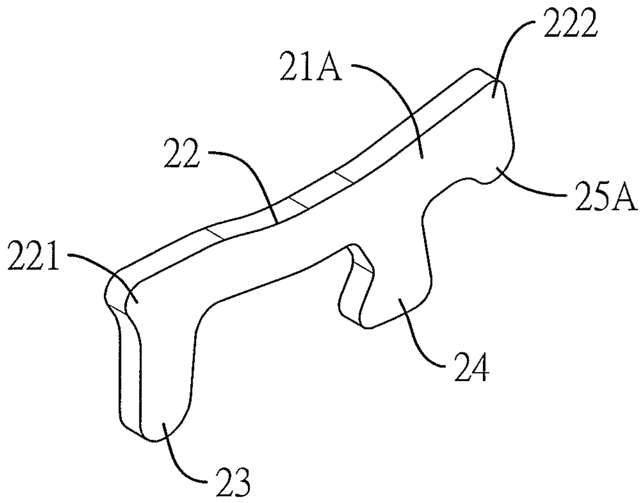
FIG. 2A is an enlarged perspective view of an electrical contacting element in FIG. 2.
Figure 5:
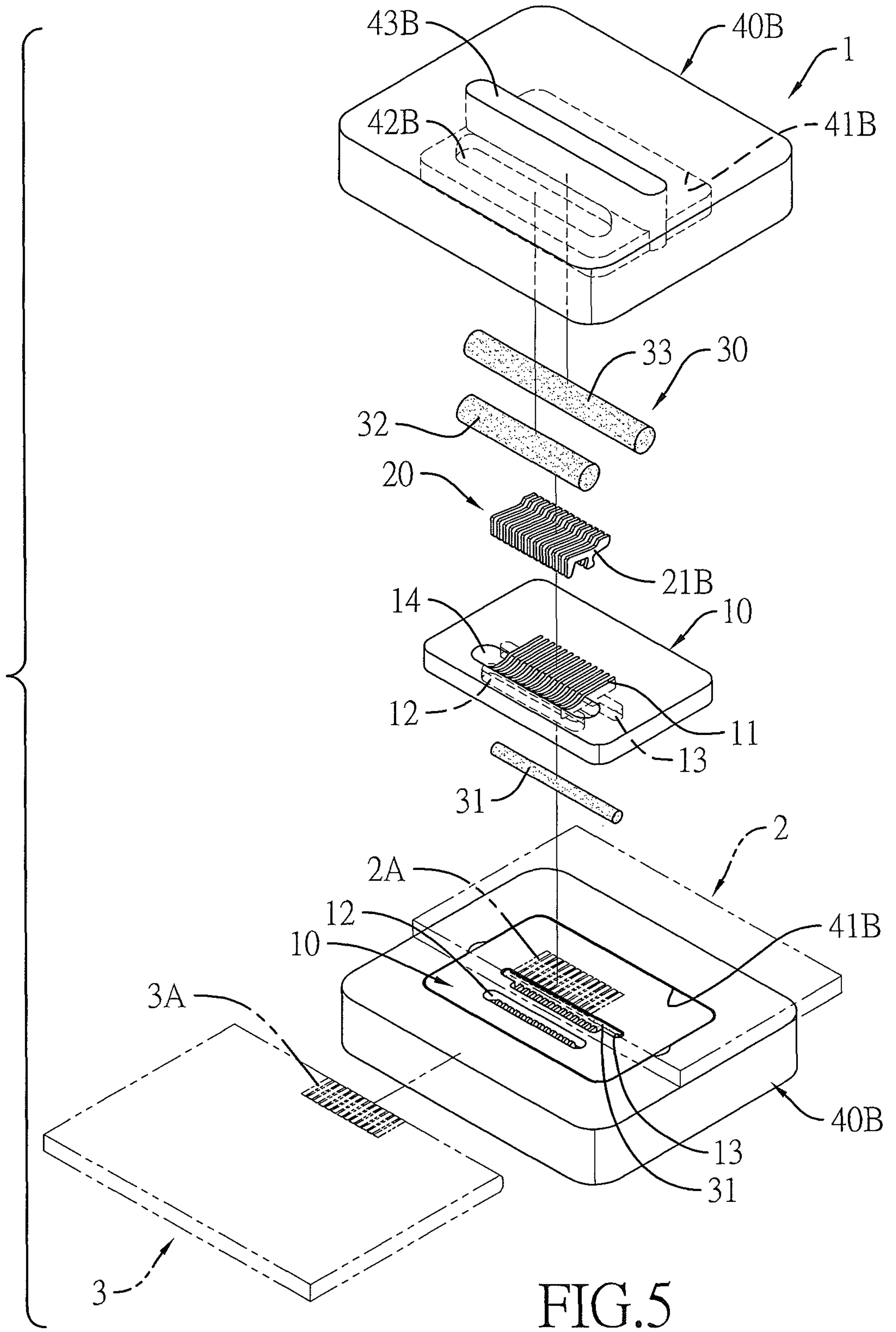
FIG. 5 is a partially exploded perspective view of a second embodiment of a connector in accordance with the present invention with a main circuit board and a sub circuit board.
Figure 5A:
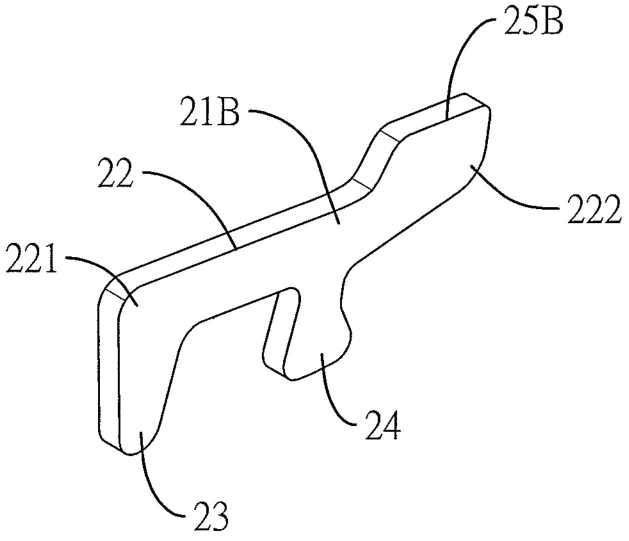
FIG. 5A is an enlarged perspective view of an electrical contacting element in FIG. 5.

With reference to FIGS. 1 and 2, a first embodiment of a connector (1 in accordance with the present invention is mounted securely on a side of a main circuit board 2 and is capable of receiving a sub circuit board 3. With further reference to FIG. 5, a second embodiment of the connector 1 with the main circuit board 2 and the sub circuit board 3 is shown. The main circuit board 2 has two opposite surfaces and two sets of multiple pad contacts 2A mounted respectively on the surfaces. The sub circuit board 3 has two opposite surfaces and two sets of multiple terminals 3A mounted respectively on the surfaces. The connector 1 of each of the first and second embodiments comprises two bases 10, two electrical contacting sets 20, two resilient bar sets 30 and two mounting brackets 40A, 40B.

With reference to FIGS. 2 to 4 or FIGS. 5 to 7, the bases 10 are arranged opposite and parallel to each other at an interval. Each base 10 has an outer surface, an inner surface, multiple insertion slots 11, a first elongated slot 12 and a second elongated slot 13. The inner surfaces of the bases 10 face each other and cooperate to clamp one of two opposite sides of the main circuit board 2. An inner circuit-board-receiving channel 1A is defined between the inner surfaces of the bases 10 adjacent to the main circuit board 2 and receives the sub circuit board 3. The insertion slots 11 are defined through base 10 and are arranged at intervals in a transverse row. The insertion slots 11 of one base 10 are arranged to align or misalign the insertion slots 11 of the other base 10. The first elongated slot 12 is defined transversely in the inner surface of the base 10 and communicates with ends of the insertion slots 11. The second elongated slot 13 is defined transversely in the inner surface of the base 10 and communicates with middle portions of the insertion slots 11.

With reference to FIGS. 2 and 4 or FIGS. 5 and 7, the electrical contacting sets 20 correspond to and are mounted respectively in the bases 10, and each electrical contacting set 20 has multiple electrical contacting elements 21A, 21B. The electrical contacting elements 21A, 21B are made of electrical conductive material, are mounted in a corresponding base 10 at intervals and may be movably mounted respectively in the insertion slots 11 of the corresponding base 10. The electrical contacting elements 21A, 21B are isolated from one another without electrically contacting one another. In other words, the electrical contacting elements 21A, 21B do not electrically contact one another through the base 10.

Each electrical contacting element 21A, 21B has a mounting portion 22, a first contacting portion 23 and a second contacting portion 24. The mounting portion 22 is longitudinal and has a head end 221 and a tail end 222. The first contacting portion 23 is formed on and protrudes inward from the head end 221 of the mounting portion 22 and extends through the first elongated slot 12 of the corresponding base 10 to contact one of the terminals 3A of the sub circuit board 3. The second contacting portion 24 is formed on and protrudes inward from a middle portion of the mounting portion 22 and extends through the second elongated slot 13 of the corresponding base 10 to contact one of the pad contacts 2A of the main circuit board 2. The sub circuit board 3 is connected electrically to the main circuit board 2 through the electrical contacting elements 21A, 21B of the electrical contacting sets 20.

With reference to FIGS. 2 and 4 or FIGS. 5 and 7, the resilient bar sets 30 correspond to and are mounted respectively on the bases 10, and correspond to the electrical contacting sets 20. Each resilient bar set 30 applies resilient force to the electrical contacting elements 21A, 21B of a corresponding electrical contacting set 20 and has an inner resilient bar 31 and two outer resilient bars 32, 33. The inner resilient bar 31 is mounted in the second elongated slot 13 of the corresponding base 10 and presses horizontally against the second contacting portion 24 of each electrical contacting element 21A, 21B of a corresponding electrical contacting set 20. The outer resilient bars 32, 33 are mounted on the outer surface of the corresponding base 10 and vertically press respectively against the head end 221 and the tail end 222 of each electrical contacting element 21A, 21B. The inner resilient bar 31 and the outer resilient bars 32, 33 cooperate to press against and secure the electrical contacting elements 21A, 21B such that the first contacting portions 23 of the electrical contacting elements 21A, 21B tightly contact the terminals 3A of the sub circuit board 3.

Figure 4:
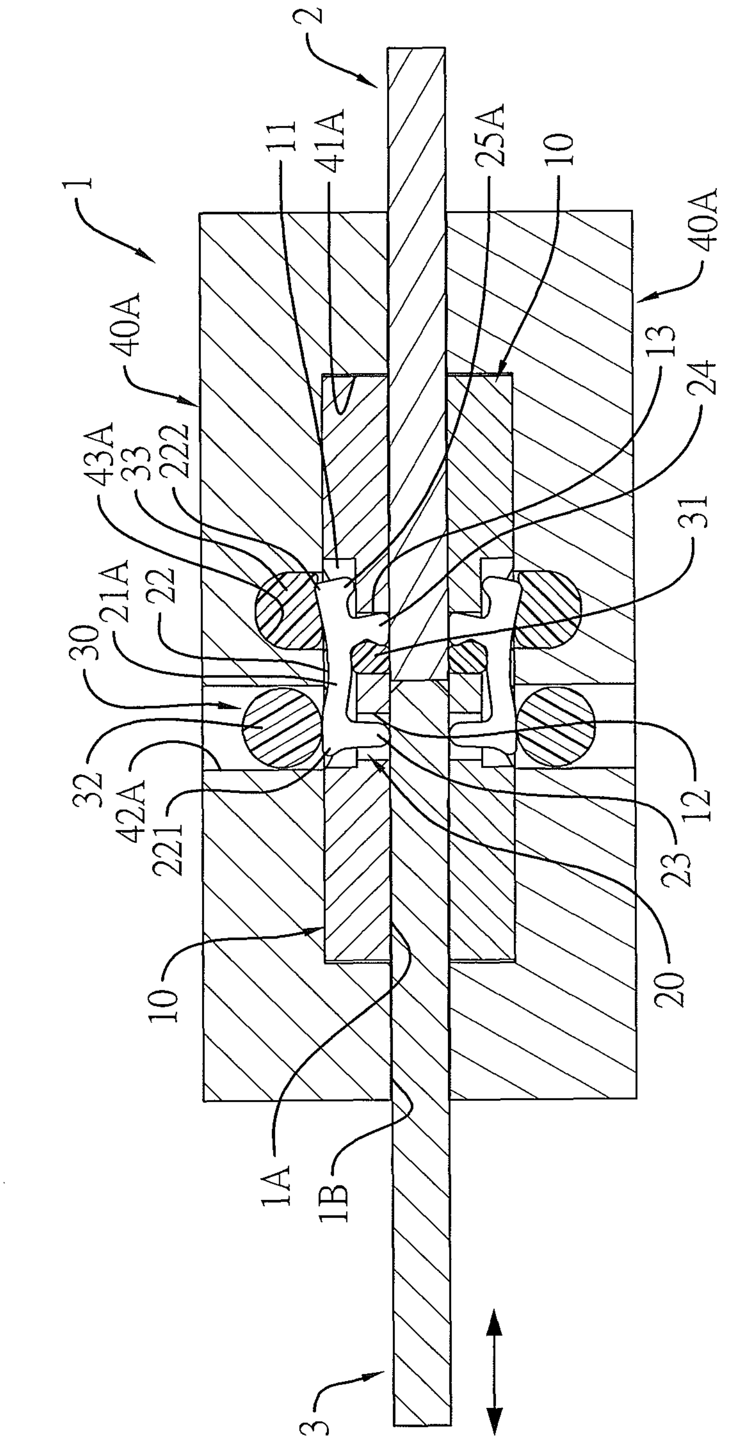
FIG. 4 is a cross sectional side view of the connector in FIG. 1 with the main circuit board and the sub circuit board.
Figure 7:
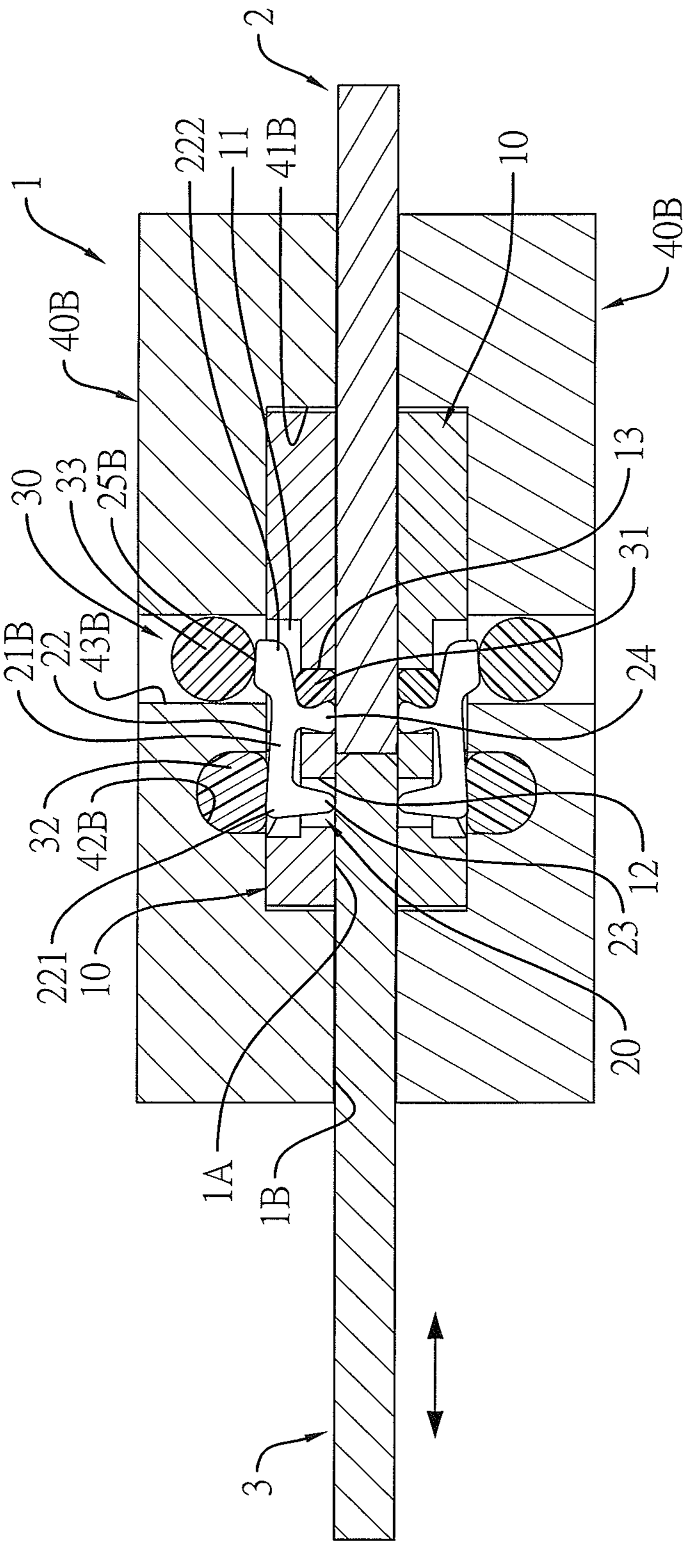
FIG. 7 is a cross sectional side view of the connector in FIG. 5 with the main circuit board and the sub circuit board.

With reference to FIGS. 2 and 4 or FIGS. 5 and 7, the mounting brackets 40A, 40B are arranged parallel at an interval, correspond to and are mounted respectively on the bases 10, correspond to and respectively cover the electrical contacting sets 20, and correspond to and respectively cover the resilient bar sets 30. Each mounting bracket 40A, 40B has an outside surface, an inside surface, an assembling recess 41A, 41B, a first chamber 42A, 42B and a second chamber 43A, 43B. The inside surfaces of the mounting brackets 40A, 40B face each other. The inside surface of each mounting bracket 40A, 40B is flush with the inner surface of the corresponding base 10. An outer circuit-board-receiving channel 1B is defined between the inside surfaces of the mounting brackets 40A, 40B adjacent to the inner circuit-board-receiving channel 1A and receives the sub circuit board 3. The assembling recess 41A, 41B is defined in the inside surface of the mounting bracket 40A, 40B and receives a corresponding base 10. Furthermore, a size of the assembling recess 41A, 41B corresponds to a size of a corresponding base 10, as shown in FIG. 4. Alternatively, the size of the assembling recess 41A, 41B is larger than the size of the corresponding base 10 such that an end space is defined between an end of the corresponding base 10 and an internal wall of the assembling recess 41A, 41B of the mounting bracket 40A, 40B, as shown in FIG. 7. The first chamber 42A, 42B is defined in the inside surface of the mounting bracket 40A, 40B and accommodates one outer resilient bar 32. The second chamber 43A, 43B is defined in the inside surface of the mounting bracket 40A, 40B and accommodates the other outer resilient bar 33.

Figure 3:
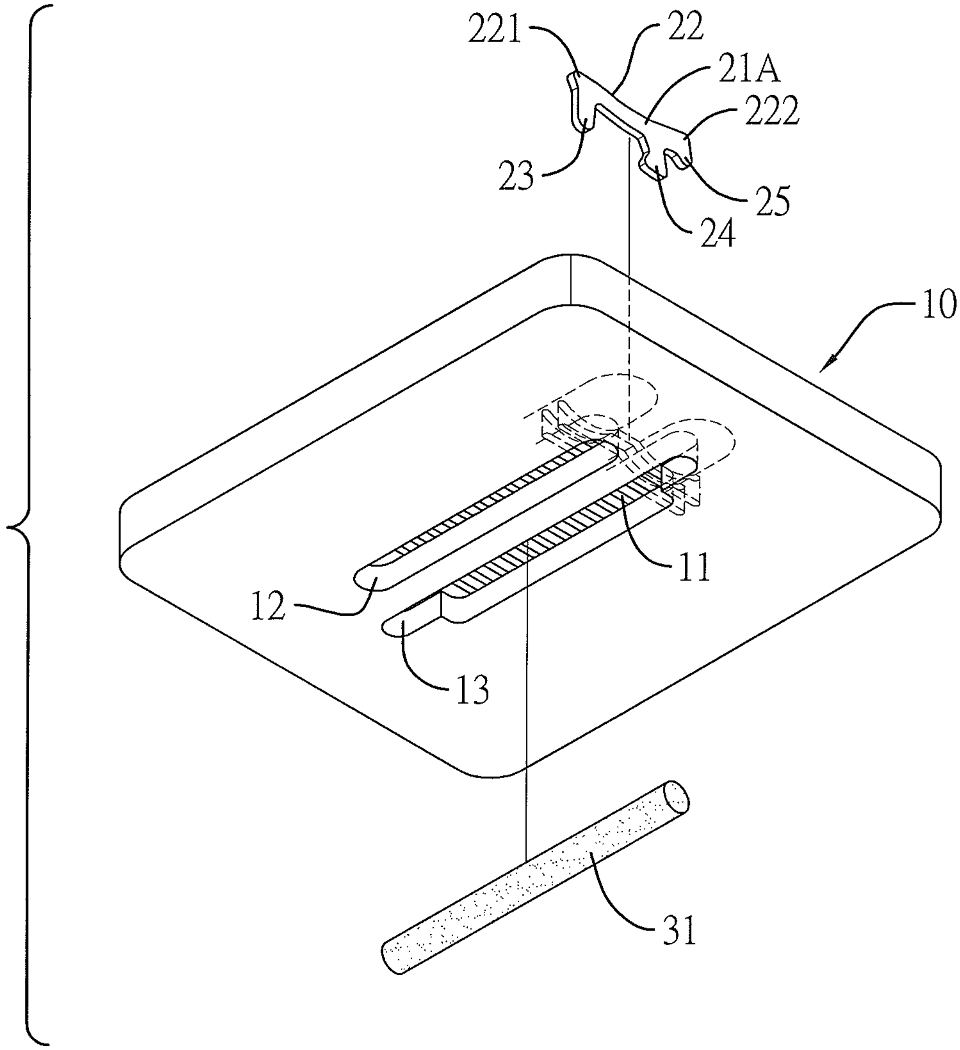
FIG. 3 is an exploded perspective view of a base, an electrical contacting element and an inner resilient bar of the connector in FIG. 2.

With reference to FIGS. 2 to 4, in the first embodiment of the connector 1, the first chamber 42A is through-hole-type and penetrates through the mounting bracket 40A from the inside surface to the outside surface. The second chamber is blind-hole-type and is formed in the inside surface of the mounting bracket 40A without penetrating through mounting bracket 40A. Each electrical contacting element 21A further has an abutment protrusion 25A formed on and protruding inward from the tail end 222 and abutting an inner wall of one of the insertion slots 11 of the corresponding base 10. The inner resilient bar 31 is located between the first contacting portion 23 and the second contacting portion 24 of each electrical contacting element 21A of the corresponding base 10, and presses against the second contacting portion 24 and an inner wall of the second elongated slot 13 of the corresponding base 10.

Figure 6:
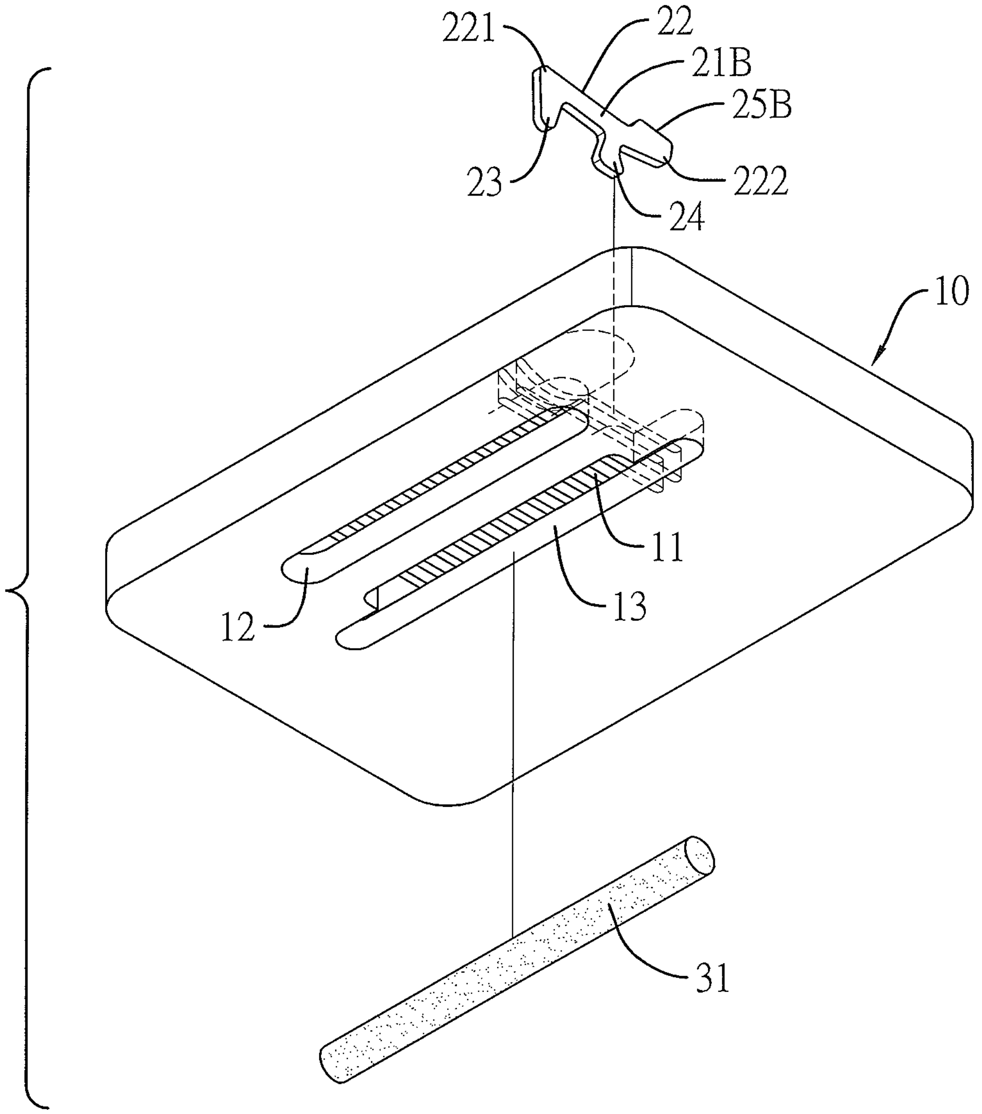
FIG. 6 is an exploded perspective view of a base, an electrical contacting element and an inner resilient bar of the connector in FIG. 5.

With reference to FIGS. 5 to 7, in the second embodiment of the connector 1, the first chamber 42B is blind-hole-type and is formed in the inside surface of the mounting bracket 40B without penetrating through mounting bracket 40B. The second chamber is through-hole-type and penetrates through the mounting bracket 40B from the inside surface to the outside surface. Each electrical contacting element 21B further has an abutment protrusion 25B formed on and protruding inward from the tail end 222 and abutting an inner wall of one of the insertion slots 11 of the corresponding base 10. The inner resilient bar 31 presses against the second contacting portion 24 of each electrical contacting element 21B of the corresponding base 10 and an inner wall of the second elongated slot 13 of the corresponding base 10. The second contacting portion 24 of each electrical contacting element 21B is located between the first contacting portion 23 and the inner resilient bar 31.

With reference to FIG. 4 or 7, when the connector 1 in accordance with the present invention is used, the bases 10 and the mounting brackets 40A, 40B cooperate to clamp and secure the main circuit board 2 and the inner circuit-board-receiving channel 1A and the outer circuit-board-receiving channel 1B receive and hold the sub circuit board 3 horizontally such that the sub circuit board 3 is electrically connected horizontally to the main circuit board 2 instead of being perpendicular to the main circuit board 2. The electrical contacting sets 20 cooperate to clamp the terminals 3A of the sub circuit board 3 and contact the pad contacts 2A of the main circuit board 2 to ensure the electrical contacting function. Therefore, the connected main circuit board 2 and the sub circuit board 3 through the connector 2 are flattened and may be mounted into a flat electronic device.

Even though numerous characteristics and advantages of the present invention have been set forth in the foregoing description, together with details of the structure and function of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A connector comprising:

two bases arranged opposite to each other and each base having an outer surface and an inner surface, wherein an inner circuit-board-receiving channel is defined between the inner surfaces of the bases;

two electrical contacting sets corresponding to and mounted respectively in the bases and each electrical contacting set having multiple electrical contacting elements mounted in a corresponding base at intervals;

two resilient bar sets corresponding to and mounted respectively on the bases and corresponding to the electrical contacting sets, and each resilient bar set applying resilient force to the electrical contacting elements of a corresponding electrical contacting set; and two mounting brackets corresponding to and mounted respectively on the bases, corresponding to and respectively covering the electrical contacting sets, corresponding to and respectively covering the resilient bar sets, and each mounting bracket having an outside surface and an inside surface, wherein an outer circuit-board-receiving channel is defined between the inside surfaces of the mounting brackets adjacent to the inner circuit-board-receiving channel.

2. The connector as claimed in claim 1, wherein the inner surfaces of the bases face each other;

each base has multiple insertion slots defined through base and are arranged at intervals in a row;

a first elongated slot defined transversely in the inner surface of the base and communicating with ends of the insertion slots; and a second elongated slot defined transversely in the inner surface of the base and communicating with middle portions of the insertion slots;

the electrical contacting elements are movably mounted respectively in the insertion slots of the corresponding base and are isolated from one another, and each electrical contacting elements has a mounting portion having a head end and a tail end;

a first contacting portion formed on and protruding inward from the head end of the mounting portion and extending through the first elongated slot of the corresponding base; and a second contacting portion formed on and protruding inward from a middle portion of the mounting portion and extending through the second elongated slot of the corresponding base;

each resilient bar set has an inner resilient bar mounted in the second elongated slot of the corresponding base and pressing against the second contacting portion of each electrical contacting element of a corresponding electrical contacting set; and two outer resilient bars mounted on the outer surface of the corresponding base and pressing respectively against the head end and the tail end of each electrical contacting element of the corresponding electrical contacting set; and the inside surfaces of the mounting brackets face each other, the inside surface of each mounting bracket is flush with the inner surface of the corresponding base, and each mounting bracket has an assembling recess defined in the inside surface of the mounting bracket and receiving a corresponding base;

a first chamber defined in the inside surface of the mounting bracket and accommodating one outer resilient bar; and a second chamber defined in the inside surface of the mounting bracket and accommodating the other outer resilient bar.

3. The connector as claimed in claim 2, wherein the first chamber is through-hole-type and penetrates through the mounting bracket from the inside surface to the outside surface;

the second chamber is blind-hole-type and is formed in the inside surface of the mounting bracket without penetrating through mounting bracket;

each electrical contacting element further has an abutment protrusion formed on and protruding inward from the tail end and abutting an inner wall of one of the insertion slots of the corresponding base; and the inner resilient bar is located between the first contacting portion and the second contacting portion of each electrical contacting element of the corresponding base, and presses against the second contacting portion and an inner wall of the second elongated slot of the corresponding base.

4. The connector as claimed in claim 3, wherein a size of the assembling recess of each mounting bracket corresponds to a size of a corresponding base.

5. The connector as claimed in claim 3, wherein a size of the assembling recess of each mounting bracket is larger than a size of the corresponding base such that an end space is defined between an end of the corresponding base and an internal wall of the assembling recess.

6. The connector as claimed in claim 2, wherein the first chamber is blind-hole-type and is formed in the inside surface of the mounting bracket without penetrating through mounting bracket;

the second chamber is through-hole-type and penetrates through the mounting bracket from the inside surface to the outside surface;

each electrical contacting element further has an abutment protrusion formed on and protruding inward from the tail end and abutting an inner wall of one of the insertion slots of the corresponding base;

the inner resilient bar presses against the second contacting portion of each electrical contacting element of the corresponding base and an inner wall of the second elongated slot of the corresponding base; and the second contacting portion of each electrical contacting element is located between the first contacting portion and the inner resilient bar.

7. The connector as claimed in claim 6, wherein a size of the assembling recess of each mounting bracket corresponds to a size of a corresponding base.

8. The connector as claimed in claim 6, wherein a size of the assembling recess of each mounting bracket is larger than a size of the corresponding base such that an end space is defined between an end of the corresponding base and an internal wall of the assembling recess.

9. The connector as claimed in claim 2, wherein a size of the assembling recess of each mounting bracket corresponds to a size of a corresponding base.

10. The connector as claimed in claim 2, wherein a size of the assembling recess of each mounting bracket is larger than a size of the corresponding base such that an end space is defined between an end of the corresponding base and an internal wall of the assembling recess.

* * * * *